(12) United States Patent
Moore et al.

(10) Patent No.: US 6,420,268 B2
(45) Date of Patent: *Jul. 16, 2002

(54) METHODS OF FORMING MATERIALS WITHIN OPENINGS, AND METHODS OF FORMING ISOLATION REGIONS

(75) Inventors: John T. Moore; Guy T. Blalock, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/910,340

(22) Filed: Jul. 20, 2001

Related U.S. Application Data

(63) Continuation of application No. 09/146,730, filed on Sep. 3, 1998, now Pat. No. 6,274,498.

(51) Int. Cl.[7] .............................................. H01L 21/302
(52) U.S. Cl. ........................ 438/692; 438/700; 438/723; 438/724
(58) Field of Search .................................. 438/691–693, 438/424–428, 700, 706, 769, 770, 791, 695, 723, 724, 745, 757

(56) References Cited

U.S. PATENT DOCUMENTS

| | | | | |
|---|---|---|---|---|
| 4,534,826 A | * | 8/1985 | Goth et al. ................... 156/643 |
| 5,374,585 A | | 12/1994 | Smith et al. ................... 437/69 |
| 5,817,566 A | * | 10/1998 | Jang et al. ................... 438/424 |
| 5,843,846 A | * | 12/1998 | Nguyen et al. ............... 438/713 |
| 5,858,865 A | * | 1/1999 | Juengling et al. ............ 438/585 |
| 5,904,523 A | * | 5/1999 | Feldman et al. ............. 438/263 |
| 5,925,575 A | * | 7/1999 | Tao et al. ..................... 438/692 |
| 5,926,722 A | * | 7/1999 | Jang et al. ................... 438/692 |
| 5,933,749 A | * | 8/1999 | Lee .............................. 438/435 |
| 5,968,842 A | * | 10/1999 | Hsiao .......................... 438/692 |
| 6,090,683 A | | 7/2000 | Torek .......................... 438/424 |
| 6,238,999 B1 | * | 5/2001 | Dickerson et al. .......... 438/424 |
| 6,274,498 B1 | * | 8/2001 | Moore et al. ................ 438/692 |

OTHER PUBLICATIONS

Wolf et al., Silicon Processing for the VLSI Era, 1986, vol. 1, pp. 522,534,541.*
S. Wolf et al, Silicon Processing for the VLSI Era, vol. 1, p. 366, 1986.
Chatterjee, A., et al., A Study of Integration Issues in SHallow Trench Isolation for Deep Submicron CMOS Tecnologies, SPIE vol. 2875, Aug. 1996, pp. 39–43.

* cited by examiner

Primary Examiner—Benjamin L. Utech
Assistant Examiner—Duy-Vu Deo
(74) Attorney, Agent, or Firm—Wells St. John P.S.

(57) ABSTRACT

In one aspect, the invention includes a method of forming a material within an opening, comprising: a) forming an etch-stop layer over a substrate, the etch-stop layer having an opening extending therethrough to expose a portion of the underlying substrate and comprising an upper corner at a periphery of the opening, the upper corner having a corner angle with a first degree of sharpness; b) reducing the sharpness of the corner angle to a second degree; c) after reducing the sharpness, forming a layer of material within the opening and over the etch-stop layer; and d) planarizing the material with a method selective for the material relative to the etch-stop layer to remove the material from over the etch-stop layer while leaving the material within the opening.

44 Claims, 7 Drawing Sheets

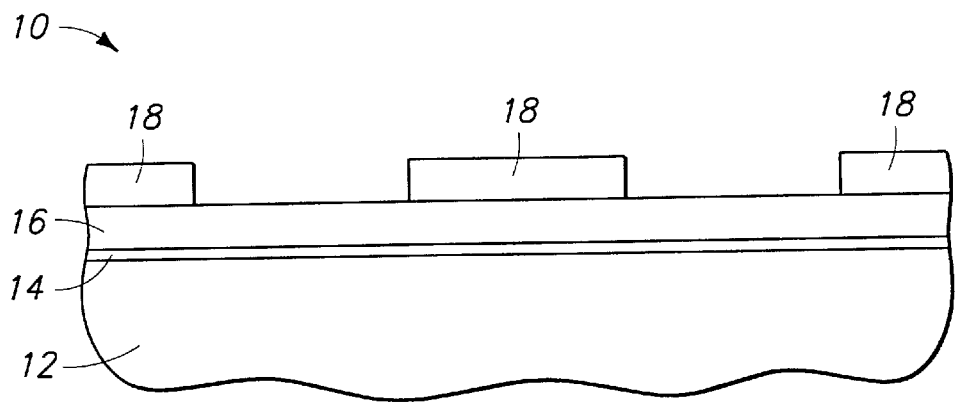
**_Fig 1_
PRIOR ART**
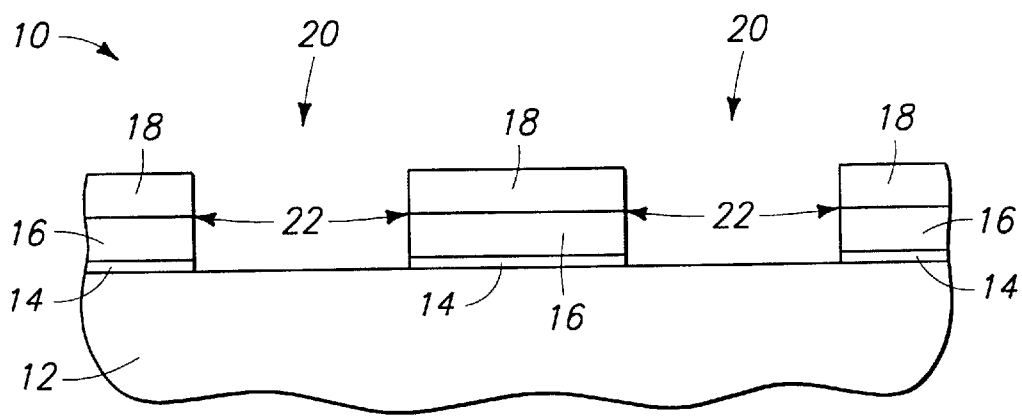
**_Fig 2_
PRIOR ART**

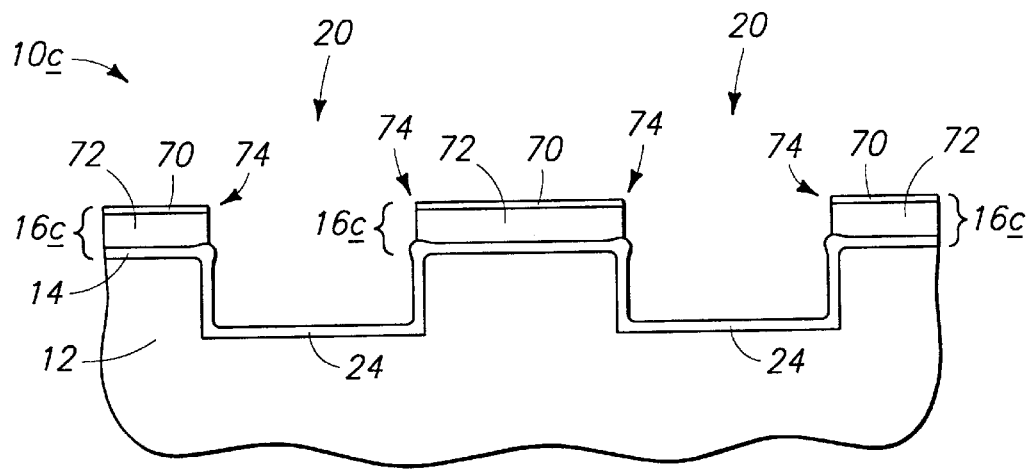
_FIG. 13_
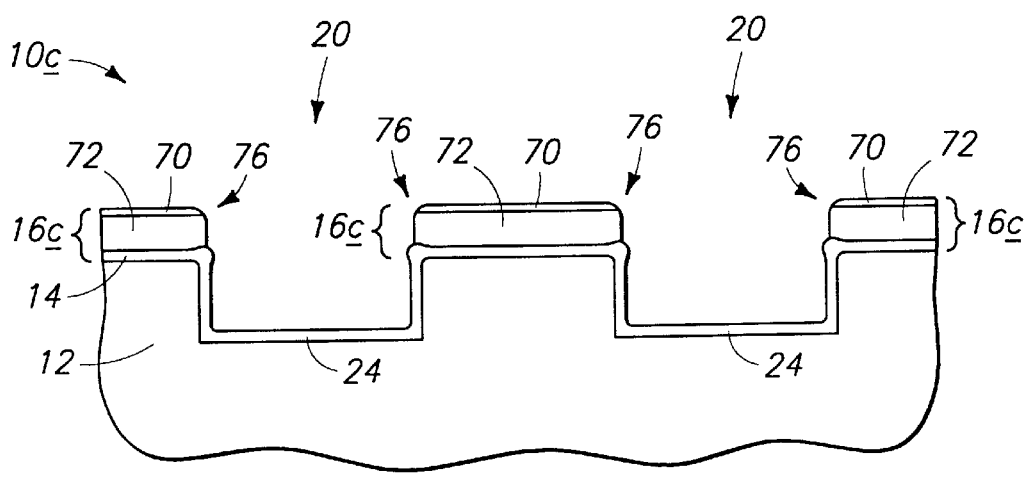
_FIG. 14_

METHODS OF FORMING MATERIALS WITHIN OPENINGS, AND METHODS OF FORMING ISOLATION REGIONS

RELATED PATENT DATA

This patent resulted from a continuation application of U.S. patent application Ser. No. 09/146,730 filed on Sep. 3, 1998. Now U.S. Pat. No. 6,274,498

TECHNICAL FIELD

The invention pertains to methods of forming materials within openings, such as, for example, methods of forming isolation regions.

BACKGROUND OF THE INVENTION

Planarization methods, such as, for example, chemical-mechanical polishing, are commonly used in semiconductor fabrication processes. An exemplary process which utilizes planarization methods is trench isolation region fabrication. Trench isolation regions generally comprise a trench or cavity formed within the substrate and filled with an insulative material, such as, for example, silicon dioxide. Trench isolation regions are commonly divided into three categories: shallow trenches (trenches less than about one micron deep); moderate depth trenches (trenches of about one to about three microns deep); and deep trenches (trenches greater than about three microns deep).

A prior art method for forming trench isolation regions is described with reference to FIGS. 1–9. Referring to FIG. 1, a semiconductor wafer fragment 10 is shown at a preliminary stage of the prior art processing sequence. Wafer fragment 10 comprises a semiconductive material 12 upon which is formed a layer of oxide 14, a layer of nitride 16, and a patterned layer of photoresist 18. Semiconductive material 12 commonly comprises monocrystalline silicon which is lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). Th term "substrate" refers to any supporting structure, including, but not limited to, the semiconductive substrates described above.

Oxide layer 14 typically comprises silicon dioxide, and nitride layer 16 typically comprises silicon nitride. Oxide layer 14 can consist essentially of silicon dioxide, and nitride layer 16 can consist essentially of silicon nitride. Nitride layer 16 is generally from about 400 Angstroms thick to about 1500 Angstroms thick.

Referring to FIG. 2, patterned photoresist layer 18 is used as a mask for an etching process. The etch is typically conducted utilizing dry plasma conditions and $CH_2F_2/CF_4$ chemistry. Such etching effectively etches both silicon nitride layer 16 and pad oxide layer 14 to form openings 20 extending therethrough. The etching stops upon reaching silicon substrate 12. The etching into nitride layer 16 defines upper corners 22 of the portions of the nitride layer remaining over substrate 12.

Referring to FIG. 3, a second etch is conducted to extend openings 20 into silicon substrate 12. The second etch is commonly referred to as a "trench initiation etch." The trench initiation etch is typically a timed dry plasma etch utilizing $CF_4$/HBr, and typically extends openings 20 to less than or equal to about 500 Angstroms into substrate 12.

Referring to FIG. 4, a third etch is conducted to extend openings 20 further into substrate 12 and thereby form trenches within substrate 12. The third etch typically utilizes an etchant consisting entirely of HBr, and is typically a timed etch. The timing of the etch is adjusted to form trenches within substrate 12 to a desired depth. For instance, if openings 20 are to be shallow trenches, the third etch will be timed to extend openings 20 to a depth of less than or equal to about one micron. As depicted, openings 20 extend into substrate 12 having an essentially square profile and essentially vertical sidewalls extending elevationally downward from and coplanar with upper corners 22 of nitride layer 16.

Referring to FIG. 5, photoresist layer 18 (FIG. 4) is removed and a first oxide fill layer 24 is thermally grown within openings 20. As depicted, first oxide fill layer 24 is contiguous with previously formed oxide layer 14, and layers 14 and 24 define essentially square corners of opening 20 in substrate 12 proximate layer 14. As also depicted, the sidewall of opening 20 within substrate 12, is recessed from the plane of upper corners 22.

Referring to FIG. 6, a high density plasma oxide 28 is formed to fill openings 20 (FIG. 5) and overlie nitride layer 16. High density plasma oxide 28 merges with oxide layer 24 (FIG. 5I) to form oxide plugs 30 within openings 20 (FIG. 5).

Referring to FIG. 7, wafer fragment 10 is subjected to planarization (such as, for example, chemical-mechanical polishing) to planarize an upper surface of oxide plugs 30. The planarization utilizes a chemistry selective for the oxide material of layer 24 (FIG. 5) relative to the material of nitride layer 16. Accordingly, nitride layer 16 functions as an etch-stop, and the planarization stops at an upper surface of nitride layer 16.

Referring to FIG. 8, nitride layer 16 is removed to expose pad oxide layer 14 between oxide plugs 30. Subsequent processing (not shown) can then be. conducted to form a polysilicon layer over and between oxide plugs 30, and to form transistor devices from the polysilicon layer. The regions between oxide plugs 30 are active regions for such transistor devices, and oxide plugs 30 are trench isolation regions separating the transistor devices.

A difficulty of the above-discussed prior art isolation-region-forming method is described with reference to FIG. 9, which illustrates a top view of wafer fragment 10 at the processing step shown in FIG. 7. Specifically, FIG. 9 illustrates a top view of wafer fragment 10 after a planarization process.

Planarization processes typically comprise polishing processes wherein an abrasive material is rubbed against a layer that is to, be planarized. For example, chemical-mechanical polishing of oxide material 28 (FIG. 6) involves rubbing a grit-containing slurry against oxide material 28. The slurry is intended to form an interface between a polishing pad and wafer fragment 10 such that the pad does not physically contact portions of wafer fragment 10. However, if there exists particles in the slurry, shear thickening of the slurry, or contact of pad to substrate, then portions of the etch stopping layer, along with portions of the substrate, can be chipped away. This can result in defects which render the device to be made inoperable.

FIG. 9 illustrates that the planarization process has chipped corners 22 of nitride layers 16 to remove portions of the nitride layers and form divots 40. Some of the nitride chipped from corners 22 has become lodged between the polishing pad and wafer fragment 10 during the planarization process. The lodged nitride scratches nitride layers 16 and oxide material 30 as it is spun by the polishing pad to form spiral scratches 42 extending across nitride layer 16 and oxide material 30. Divots 40 and scratches 42 damage oxide regions 30 and can adversely impact further processing and utilization of wafer fragment 10. Accordingly, it would be desirable to develop methods which alleviate chipping of etch-stop layers during planarization processes.

SUMMARY OF THE INVENTION

In one aspect, the invention encompasses a method of forming a material within an opening. An etch-stop layer is formed over a substrate. The etch-stop layer has an opening extending therethrough to expose a portion of the underlying substrate and comprises an upper corner at a periphery of the opening. The upper corner has a corner angle with a first degree of sharpness. A portion of the upper corner is removed to reduce the sharpness of the corner angle to a second degree. After the portion of the upper corner is removed, a layer of material is formed within the opening and over the etch-stop layer. The material is planarized with a method selective for the material relative to the etch-stop layer to remove the material from over the etch-stop layer while leaving the material within the opening.

In another aspect, the invention encompasses a method of forming an isolation region. A nitride-containing layer is formed over a semiconductor substrate. An opening is formed to extend through the nitride-containing layer and into the underlying substrate. The nitride-containing layer comprises an upper corner at a periphery of the opening. The upper corner has a corner angle with a first degree of sharpness. A portion of the upper corner is removed to reduce the sharpness of the corner angle to a second degree. After the portion of the upper corner is removed, an insulative material is formed within the opening and over the nitride-containing layer. The insulative material is planarized to remove the material from over the nitride-containing layer while leaving the material within the opening in the semiconductive substrate. The material within the opening in the semiconductive substrate forms at least a portion of an isolation region.

BRIEF DESCRIPTION OF THE DRAWINGS

Preferred embodiments of the invention are described below with reference to the following accompanying drawings.

FIG. 1 is a diagrammatic, fragmentary, cross-sectional view of a semiconductor wafer fragment at a preliminary step of a prior art processing sequence.

FIG. 2 shows the FIG. 1 wafer fragment at a prior art processing step subsequent to that of FIG. 1.

FIG. 13 shows the FIG. 12 wafer fragment at a processing step subsequent to that of FIG. 12.

FIG. 14 shows the FIG. 12 wafer fragment at a processing step subsequent to that of FIG. 13.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first embodiment method of the present invention is described with reference to FIG. 10. In referring to FIG. 10, similar numbering to that utilized above in describing FIGS. 1–9 is used, with differences indicated by the suffix "a" or by different numerals.

Figure 3:
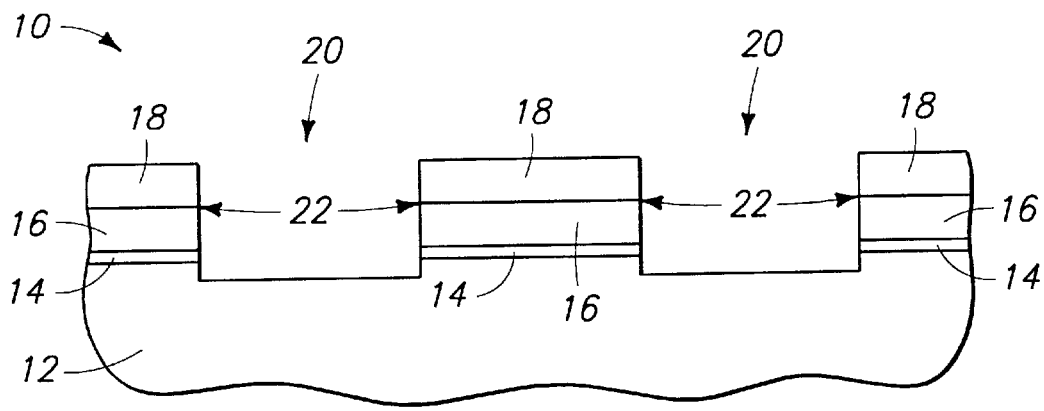
FIG. 3 shows the FIG. 1 wafer fragment at a prior art processing step subsequent to that of FIG. 2.
Figure 4:
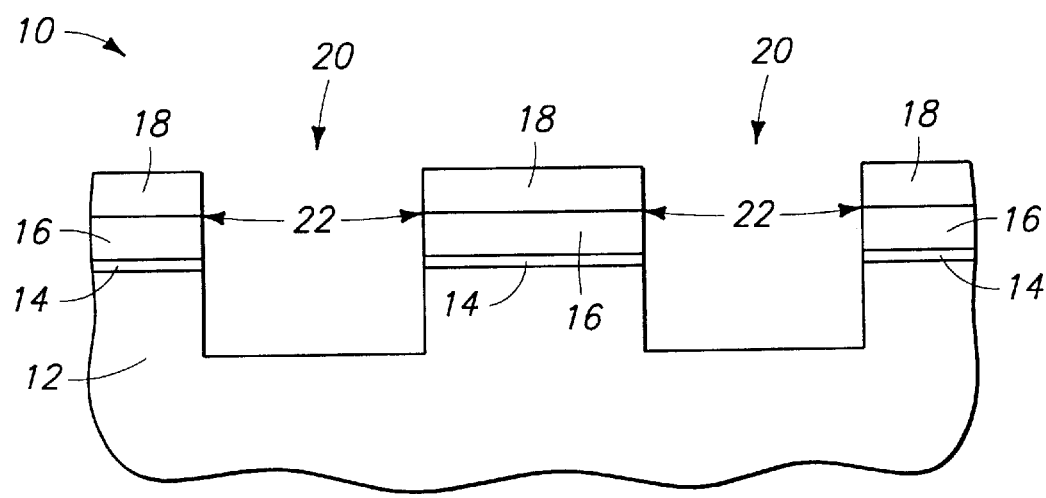
FIG. 4 shows the FIG. 1 wafer fragment at a prior art processing step subsequent to that of FIG. 3.
Figure 5:
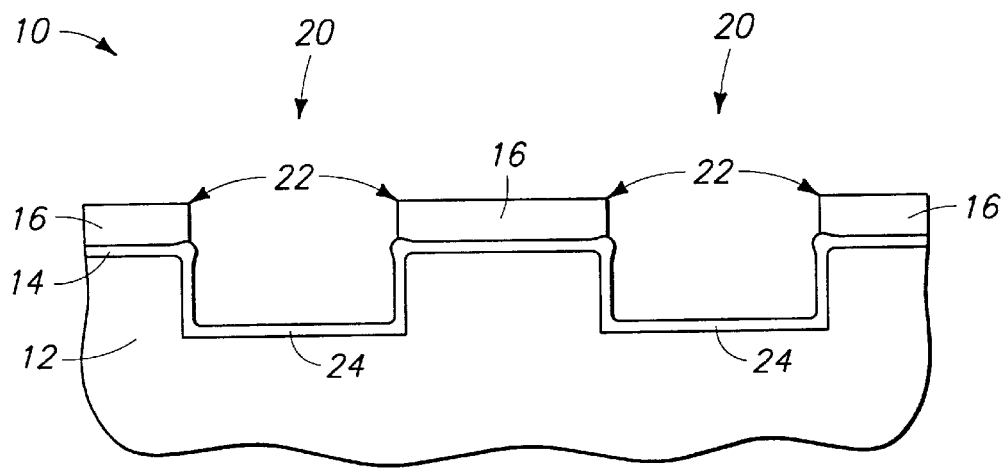
FIG. 5 shows the FIG. 1 wafer fragment at a prior art processing step subsequent to that of FIG. 4.
Figure 10:
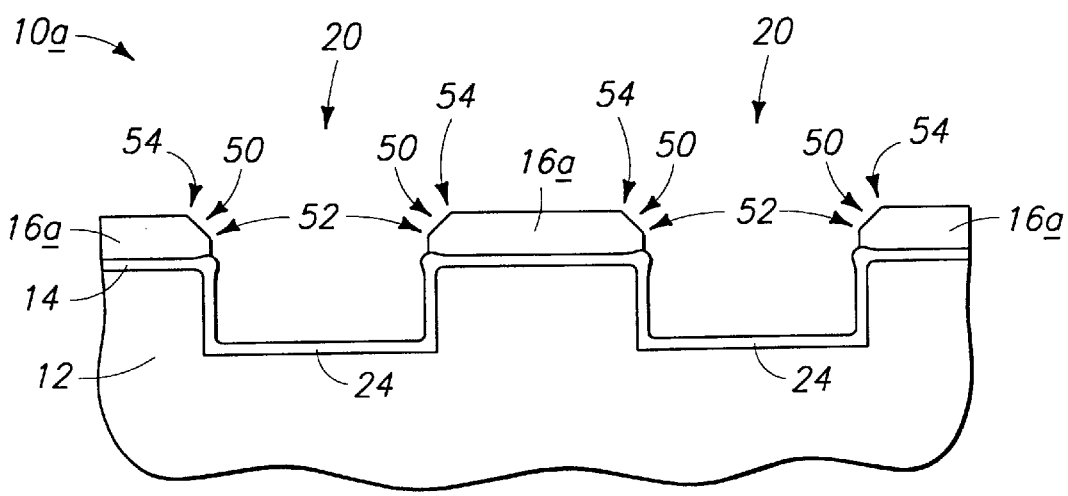
FIG. 10 is a diagrammatic, fragmentary, cross-sectional view of a semiconductor wafer fragment processed according to a first embodiment method of the present invention.

A semiconductor wafer fragment 10a is illustrated in FIG. 10 at a processing step subsequent to the prior art processing step illustrated in FIG. 5. Wafer fragment 10a comprises a substrate 12, a pad oxide layer 14, an etch-stop layer 16 overlying oxide layer 14 and first oxide fill layer 24 contiguous with oxide layer 14. Etch-stop layer 16a can comprise identical materials as etch-stop layer 16 of FIG. 5, such as, for example, silicon nitride. Wafer fragment 10a differs from the wafer fragment 10 of FIG. 5 in that nitride-containing etch-stop layer 16 (FIG. 5) has been subjected to a facet etch to reduce a sharpness of corners 22 (FIG. 5) and form etch-stop layer 16a of FIG. 5. Specifically, corners 22 of FIG. 5 have a first degree of sharpness (shown as about a 90° angle). In contrast, etch-stop layer 16a comprises a facet 50 in place of corner 22 (FIG. 5), and has effectively replaced corner 22 with a pair of corners 52 and 54. Each of corners 52 and 54 comprises an angle greater than the about 90° angle of corner 22 (FIG. 5). Accordingly, the facet-etching of the exemplary first embodiment processing has effectively removed a portion of upper corner 22 (FIG. 5) to reduce a sharpness, of the corner angle from a first degree (here about 90°) to a second degree (which here comprises an angle of greater than 90°). As depicted, the square corners of opening 20 remain unchanged by the facet etch.

In embodiments wherein layer 16a comprises silicon nitride, the layer can be facet-etched by, for example, a plasma etch utilizing argon. An exemplary pressure to which wafer fragment 10a is subjected during such plasma etch is from about 2 mTorr to about 20 mTorr. The etching typically takes place in a reaction chamber, with an exemplary rate of flow of argon gas into the reaction chamber being from about 10 to about 100 standard cubic centimeters per minute, and with about 50 standard cubic centimeters per minute being typical. Power within the reaction chamber cad be from about 100 watts to about 1,000 watts as a power at a top of the chamber, and from about 0 watts to about 1,000 watts as a power at a bottom of the chamber. A chuck temperature within the reaction chamber can float to about 400° C. The reaction chamber can be, for example, either a dual source plasma etcher or a single source plasma etcher.

The above-described conditions for facet etching are merely exemplary conditions, and persons of ordinary skill in the art will recognize that other conditions are known. However, regardless of the conditions utilized for the facet etching, it is preferable that a fluorine-containing compound (such as, for example, $CF_4$) be included during the plasma etching. Such fluorine-containing compound can volatilize nitride material during the facet etch such that the material will not otherwise deposit in openings 20.

It is noted that the facet etching can be conducted in a completely separate etch step from the step of removal of photoresist layer 18 (FIG. 4), or as a continuation of a photoresist stripping etch. Specifically, photoresist layer 18 can be removed by, for example, an etch utilizing gas mixtures including $O_2$, $CF_4$ and/or inert gas such as $N_2$ or Ar, which would also etch nitride layer 16a to form facets 50.

After the formation of facets 50, similar processing to that described above with: reference to FIGS. 6–8 can be conducted to form a material (such as, for example, an oxide) over etch-stop layer 16 and within openings 20, and to planarize the material. The facet etching of nitride layer 16 (FIG. 5) reduces the possibility that corners of etch-stop layer 16 will be chipped during planarization (such as, for example, chemical-mechanical polishing) of the material from over etch-stop layer 16. Accordingly, the facet etching of the present invention can alleviate or eliminate the chipping and scratching problems of the prior art that were discussed above with reference to FIG. 9.

Figure 6:
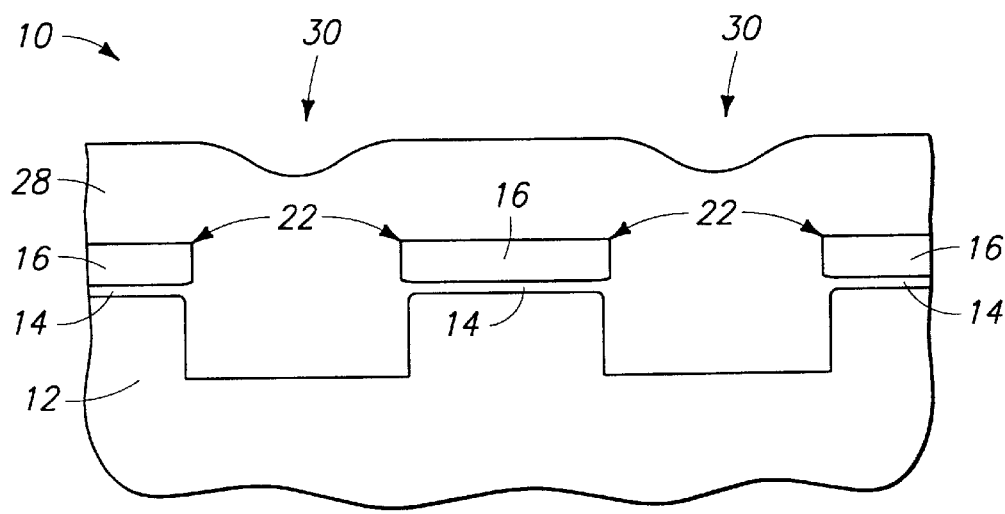
FIG. 6 shows the FIG. 1 wafer fragment at a prior art processing step subsequent to that of FIG. 5.
Figure 7:
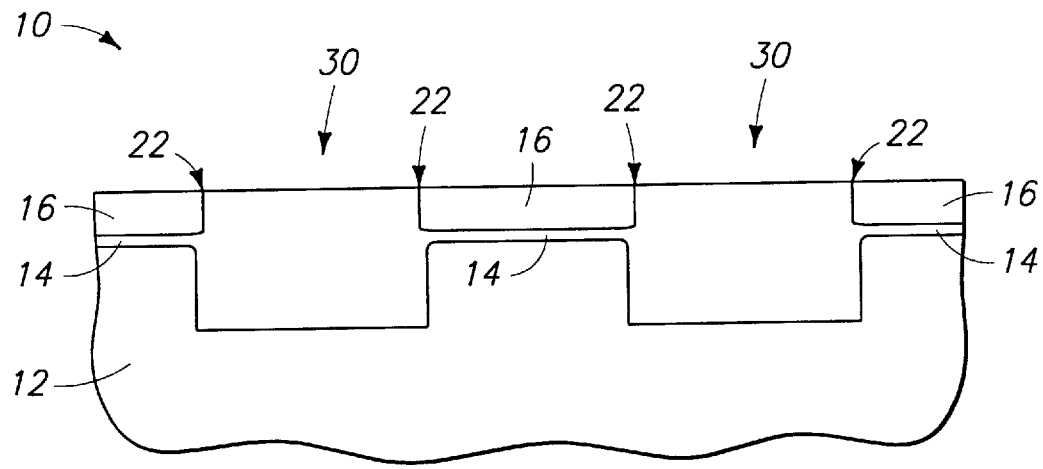
FIG. 7 shows the FIG. 1 wafer fragment at a prior art processing step subsequent to that of FIG. 6.
Figure 8:
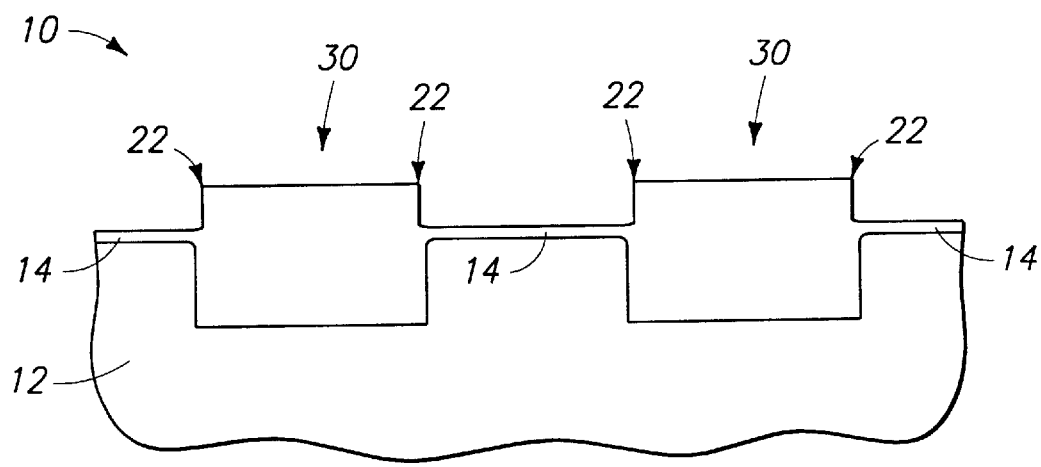
FIG. 8 shows the FIG. 1 wafer fragment at a prior art processing step subsequent to that of FIG. 7.
Figure 9:
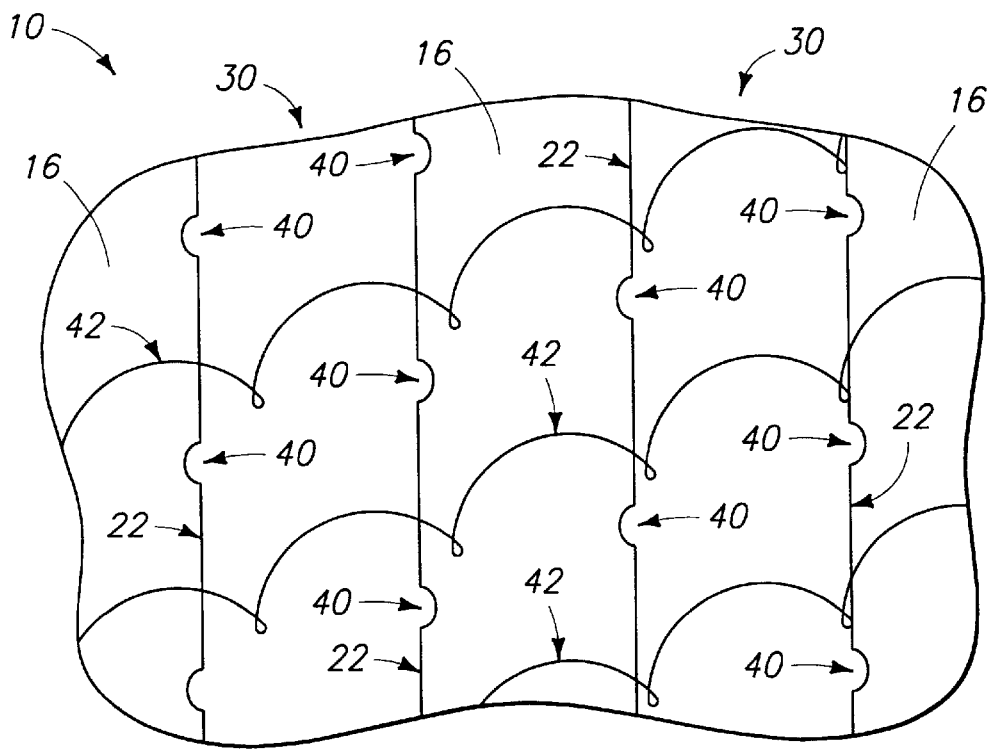
FIG. 9 shows a top view of the FIG. 1 wafer fragment at a prior art processing step identical to that shown in FIG. 7.

It is noted that the faceted edges of nitride layer 16a can lead to overhanging oxide ledges (not shown) of isolation oxide formed within openings 20 during application of the subsequent processing of FIGS. 6–8 to the structure of FIG. 10. Specifically, such overhanging oxide ledges can result after nitride layer 16a is removed in processing analogous to that described above with reference to FIG. 8. If such overhanging oxide ledges are formed, they are preferably removed prior to formation of transistor devices proximate the isolation oxide. The overhanging oxide ledges can be removed by, for example, chemical-mechanical polishing of the isolation oxide or appropriate wet chemical treatments.

A second embodiment of the present invention is described with reference to FIG. 11. In describing the embodiment of FIG. 11, similar numbering to that utilized above in describing prior art FIGS. 1–9 is used, with differences indicated by the suffix "b", or by different numerals.

Figure 11:
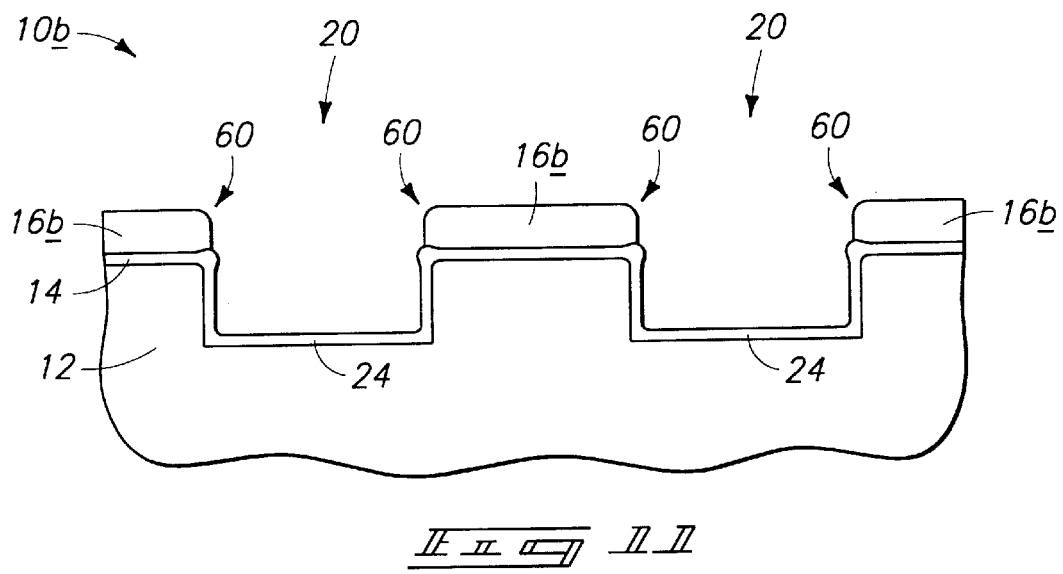
FIG. 11 is a diagrammatic, fragmentary, cross-sectional view of a semiconductor wafer fragment processed according to a second embodiment method of the present invention.

FIG. 11 illustrates a semiconductor wafer fragment 10b at a processing step subsequent to the prior art step illustrated in FIG. 5. Wafer fragment 10b comprises a substrate 12, a pad oxide layer 14, an etch-stop layer 16b, and first oxide fill layer 24 contiguous with oxide layer 14. Etch-stop layer 16b can comprise identical mate rials as etch-stop layer 16 of FIG. 5, such as, for example, silicon nitride. Wafer fragment 10b differs from wafer fragment 10 of FIG. 5 in that etch-stop layer 16 of FIG. 5 has been subjected to an anisotropic etch to round corners 22 (FIG. 5) and form rounded corners 60 of etch-stop layer 16b. As depicted, the square corners of opening 20 remain unchanged by the anisotropic etch to form rounded corners 60. The anisotropic etch can comprise, for example, an etch utilizing $CF_4/CHF_3$, a power of greater than 0 and less than about 1000 watts, a temperature of less than about 5° C., and a pressure of less than about 300 mTorr.

The anisotropic etching of layer 16b removes a portion of corner 22 (FIG. 5) to reduce a sharpness of the corner. In other words, the anisotropic etching reduces a corner angle of etch-stop layer 16 from a first degree of sharpness (corresponding to the sharpness of corner 22 of etch-stop layer 16 in FIG. 5) to a second degree of sharpness (corresponding to the rounded features of corners 60 etch-stop layer 16b of FIG. 11).

After the anisotropic etching to form rounded corners 60, wafer fragment 10b can be subjected to subsequent processing similar to that described above with reference to FIGS. 6–8 to form a material (such as, for example, silicon dioxide) within openings 20 and over etch-stop layer 16b, and to subsequently planarize the material down to an upper surface of etch-stop layer 16b. Etch-stop layer 16b can then be removed, and the material utilized for forming isolation regions between transistor devices.

It is noted that the rounded edges of nitride layer 16b can lead lo to overhanging oxide ledges (not shown) of isolation oxide formed during application of the subsequent processing of FIGS. 6–8 to the structure of FIG. 11. If such overhanging oxide ledges are formed, they are preferably removed prior to formation of transistor devices adjacent the isolation oxide. Such overhanging oxide ledges can be removed by, for example, chemical-mechanical polishing of the isolation oxide after removal of etch-stop layer 16b.

It is also noted that corners 22 (FIG. 5) can be rounded by etching processes other than the anisotropic etch described above. For instance, corners 22 can be rounded by exposing a nitride-containing layer 16 (FIG. 5) to a dip in hot phosphoric acid. Exemplary conditions for such hot phosphoric acid dip include a phosphoric acid solution having a concentration of about 86% (by weight), a temperature of the phosphoric acid of about 155° C., atmospheric pressure, and a dip time of from about 30 seconds to about 3 minutes.

A third embodiment of the present invention is discussed with reference to FIGS. 12–14. In describing the embodiment of FIGS. 12–14, similar numbering to that utilized above in describing the prior art processing of FIGS. 1–9 is used, with differences indicated by the suffix "c" or by different numbers.

Figure 12:
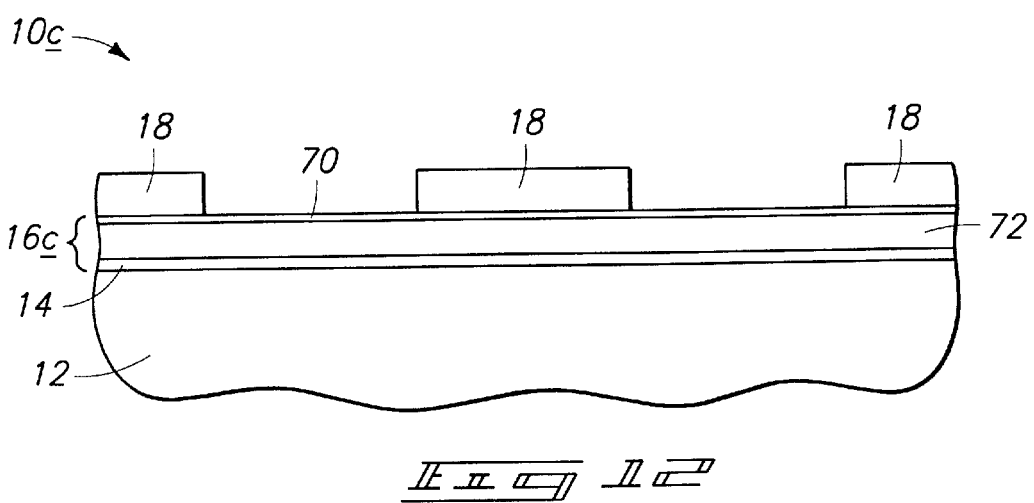
FIG. 12 is a diagrammatic, fragmentary, cross-sectional view of a semiconductor wafer fragment processed according to a third embodiment method of the present invention.

FIG. 12 illustrates a semiconductor wafer fragment 10c at a processing step similar to the prior art processing step of FIG. 1. A difference between semiconductor wafer fragment 10c of FIG. 12 and wafer fragment 10 of FIG. 1 is that wafer fragment 10c comprises an etch-stop layer 16c having two distinct portions, whereas wafer fragment 10 comprises an etch-stop layer 16 containing only one portion. The two portions of etch-stop layer 16c are an upper portion 70 and a lower portion 72. Preferably, upper portion 70 has a faster etch rate when exposed to subsequent etching conditions than does lower portion 72. For example, in applications wherein etch-stop layer 16c comprises nitride, upper portion 70 can comprise $Si_xN_yO_z$, wherein x, y and z are greater than zero, and lower portion 72 can consist essentially of SiN. Upper portion 70 will then etch faster relative to lower portion 72 under subsequent etching conditions comprising exposing nitride-containing layer 16c to hydrofluoric acid.

A lower portion 72 consisting essentially of SiN can be formed by, for example, chemical vapor deposition utilizing $SiH_2Cl_2$ and $NH_3$. Upper portion 70 comprising $Si_xN_yO_z$ can then be formed by, for example, chemical vapor deposition utilizing $SiH_2Cl_2$, $NH_3$ and $N_2O$. Alternatively, upper portion $Si_xN_yO_z$ can be formed by oxidizing an upper surface of silicon nitride lower portion 72. Such oxidation can comprise, for example, rapid thermal processing at al temperature of from about 1,000° C. to about 1,100° C. in an oxidizing ambient (e.g., $O_2$, $NO_x$, $H_2O_2$, etc.) for a time of from about 30 seconds to about three minutes.

An exemplary process of forming lower portion 72 comprising SiN and upper portion 70 comprising $Si_xN_yO_z$ is as follows. Lower portion 72 is formed by chemical vapor deposition utilizing $SiH_2Cl_2$ and $NH_3$ as precursors, in a reaction chamber at a temperature of from about 650° C. to about 800° C., and at a pressure of from about 100 mTorr to about 500 mTorr. After a period of time sufficient to grow layer 72 to a suitable thickness, $N_2O$ is introduced into the reaction chamber as another precursor. The combination of $N_2O$, $SiH_2Cl_2$ and $NH_3$ precursors grows upper layer 70 comprising $Si_xN_yO_z$. Preferably, lower portion 72 of nitride layer 16c is formed to a thickness of from greater than 0 Angstroms to about 900 Angstroms, and upper portion 70 is formed to a thickness of from about 50 Angstroms to about 500 Angstroms.

A hydrofluoric acid etch of layer 16c is described with reference to FIGS. 13 and 14. Referring to FIG. 13, wafer fragment 12 is subjected to processing analogous to the processing described above with reference to FIGS. 2–5, to form openings 20 extending through etch-stop layer 16c and into substrate 12. As depicted, oxide layer 14 underlies etch-stop layer 16c and is contiguous with oxide fill layer 24, layers 14 and 24 defining essentially square corners of opening 20 in substrate 12. Etch-stop layer 16c comprises upper corners 74 having a first degree of roughness.

Referring to FIG. 14, wafer fragment 10c is subjected to a dip in hydrofluoric acid solution which rounds corners 74 (FIG. 13) to form corners 76 having a second degree of sharpness which is less than the first degree of sharpness of corners 74. As depicted, the square corners of opening 20 remain unchanged by the dip to form corners 76.

In subsequent processing (not shown) wafer fragment 10c can be subjected to the processing of FIGS. 6–8 to form isolation regions analogous to isolation regions 30 of FIG. 8. Rounded corners 76 can avoid the prior art chipping and scratching problems discussed above with reference to FIG. 9.

As another example nitride layer 16c suitable for the third embodiment of the present invention, lower portion 72 can comprise silicon nitride comprising a first stoichiometric amount of silicon, and upper portion 72 can comprise silicon nitride comprising a second stoichiometric amount of silicon that is greater than the first stoichiometric amount of silicon. Upper portion 70 will then etch faster than lower portion 72 when nitride layer 16c is exposed to planarizing conditions, such as the conditions described above with reference to prior art FIG. 7. A method of forming such nitride layer 16c comprising a first stoichiometric amount of silicon in lower portion 72 and a second stoichiometric amount of silicon in upper portion 70 is as follows. A chemical vapor deposition (CVD) process is utilized with a silicon precursor gas (for example $SiH_2Cl_2$ (dichlorosilane)) and a nitrogen precursor gas (for example, $NH_3$ (ammonia)). A substrate is provided within a CVD reaction chamber, together with a first ratio of the silicon precursor gas to the nitrogen precursor gas. The first ratio of the silicon precursor gas to the nitrogen precursor gas can be about 0.33 to form a lower portion 72 having a stoichiometry of about $Si_3N_4$. Subsequently, the ratio of the silicon precursor gas to the nitrogen precursor gas is raised to, for example, about 6 to form a silicon enriched upper portion 72 of the silicon nitride layer. The silicon enriched upper portion has a stoichiometry of $Si_xN_y$, wherein the ratio of x to y is greater than or equal to 1. The silicon enriched upper portion can comprise, for example, $Si_4N_4$, $Si_7N_4$, $Si_{10}N_1$, or, if the flow of nitrogen precursor gas is effectively ceased, Si. Exemplary processing conditions for the CVD process can include a pressure of from about 100 mTorr to about 1 Torr, and a temperature of from about 700° C. to about 800° C.

Yet another method of forming etch-stop layer 16c of silicon nitride is to form lower portion 72 from silicon nitride utilizing chemical vapor deposition of $SiH_2Cl_2$ and $NH_3$ without a plasma, and to form upper portion 70 utilizing plasma enhanced chemical vapor deposition in the presence of an oxygen-containing precursor, $SiH_4$ and $NH_3$. Lower portion 72 can then consist essentially of silicon and nitrogen, and upper portion 70 can then comprise $Si_xN_yO_z$ wherein x, y and z are greater than 1. As discussed previously, such upper portion is more rapidly etched by a hydrofluoric acid etch than is such lower portion.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a material within an opening, comprising:

forming an etch-stop layer over a substrate, the etch-stop layer having an opening extending therethrough exposing a portion of the underlying substrate and the etch-stop layer comprising an upper corner at a periphery of the opening, the upper corner having a corner angle with a first degree of sharpness;

extending the opening into the substrate and forming a first layer of material comprising silicon oxide within the opening extended into the substrate, the layer not filling the opening and defining a lateral dimension of the extended opening;

reducing the sharpness of the corner angle of the etch stop layer to a second degree, the lateral dimension remaining essentially unchanged;

after reducing the sharpness and forming the first layer, forming a second layer of material within the opening and over the etch-stop layer, the second layer filling the opening extended into the substrate; and polishing the material to remove the material from over the etch-stop layer while leaving the material within the opening.

2. The method of claim 1 wherein the material comprises silicon dioxide and the etch-stop layer comprises silicon nitride.

3. The method of claim 1 wherein the polishing comprises chemical-mechanical polishing.

4. A method of forming a material within an opening in a substrate, comprising:

forming a nitride-containing layer over a substrate, the nitride-containing layer overlying a pad oxide layer and having an opening extending therethrough exposing a portion of the underlying substrate, the nitride-containing layer comprising an upper corner at a periphery of the opening, the upper corner having a corner angle with a first degree of sharpness;

etching the exposed substrate to further extend the opening into the substrate;

forming a first layer of material within the opening extended into the substrate, the first layer not filling the opening, wherein the first layer is contiguous with the pad oxide layer, the first layer and pad oxidie layer defining essentially square corners of the opening extended into the substrate;

after forming the first layer of material, removing a portion of the upper corner of the etch-stop layer to reduce the sharpness of the corner angle to a second degree, the removing not reducing a sharpness of the essentially square corners of the opening;

after removing the portion of the upper corner, forming a second layer of material within the opening and over the nitride-containing layer, the second layer filling the opening extended into the substrate; and planarizing the material to remove the material from over the nitride-containing layer while leaving the material within the opening in the nitride-containing layer.

5. The method of claim 4 wherein the nitride-containing layer comprises silicon nitride.

6. The method of claim 4 wherein the nitride-containing layer consists essentially of silicon nitride.

7. The method of claim 4 wherein the removing the portion of the upper corner comprises facet etching the upper corner.

8. The method of claim 4 wherein the removing the portion of the upper corner comprises facet etching the upper corner, the facet etching comprising exposing the nitride-containing layer to a fluorine-containing compound.

9. The method of claim 4 wherein the removing the portion of the upper corner comprises anisotropically etching the nitride-containing layer.

10. The method of claim 4 wherein the removing the portion of the upper corner comprises exposing the nitride-containing layer to hot phosphoric acid.

11. The method of claim 4 further comprising:
forming a patterned layer of photoresist over the nitride-containing layer, the opening in the nitride-containing layer being formed by transferring a pattern from the photoresist to the nitride-containing layer;
removing the photoresist with a photoresist etch chemistry that can also etch the nitride-containing layer; and
continuing to expose the nitride-containing layer to the photoresist etch chemistry after removal of the photoresist to remove the portion of the upper corner.

12. The method of claim 4 wherein the layer of material comprises silicon dioxide.

13. The method of claim 4 wherein the layer of material consists essentially of silicon dioxide.

14. A method of forming a material within an opening in a substrate, comprising:
forming a nitride-containing layer over a substrate, the nitride-containing layer comprising at least two portions, one of the at least two portions being an upper portion and the other of the at least two portions being a lower portion, the upper portion etching faster when exposed to subsequent etching conditions than does the lower portion, the nitride-containing layer having an opening extending therethrough exposing a portion of the underlying substrate, the nitride-containing layer comprising an upper corner at a periphery of the opening, the upper corner having a corner angle with a first degree of sharpness;
removing a portion of the upper corner by the subsequent etching to reduce the sharpness of the corner angle to a second degree;

forming a layer of material within the opening and over the nitride-containing layer; and planarizing the material to remove the material from over the nitride-containing layer while leaving the material within the opening in the nitride-containing layer.

15. The method of claim 14 wherein:
the forming the nitride-containing layer comprises:
forming the lower portion of silicon nitride; and
forming $Si_xN_yO_z$ wherein x, y and z are greater than zero, over an upper surface of the silicon nitride to form the upper portion; and
the subsequent etching conditions comprise exposing the nitride-containing layer to HF.

16. The method of claim 15 wherein:
the forming the lower portion of silicon nitride comprises chemical vapor deposition utilizing $SiH_2Cl_2$ and $NH_3$; and
the forming the upper portion of $Si_xN_yO_z$ comprises chemical vapor deposition utilizing $SiH_2Cl_2$, $NH_3$ and $N_2O$.

17. The method of claim 14 wherein:
the forming the nitride-containing layer comprises:
forming the lower portion of silicon nitride; and
oxidizing an upper surface of the silicon nitride to form the upper portion; and
the subsequent etching conditions comprise exposing the nitride-containing layer to HF.

18. The method of claim 14 wherein:
the forming the nitride-containing layer comprises:
forming the lower portion of silicon nitride utilizing CVD without a plasma; and
forming the upper portion of silicon nitride utilizing plasma enhanced CVD with an oxygen-containing precursor; and
the subsequent etching conditions comprise exposing the nitride-containing layer to HF.

19. The method of claim 14 wherein the layer of material comprises silicon dioxide.

20. The method of claim 14 wherein the layer of material consists essentially of silicon dioxide.

21. The method of claim 14 wherein the nitride-containing layer comprises silicon nitride.

22. The method of claim 14 wherein the nitride-containing layer consists essentially of silicon nitride.

23. A method of forming an isolation region, comprising:
forming a nitride-containing layer over a semiconductor substrate;
forming an opening extending through the nitride-containing layer and into the underlying substrate, the nitride-containing layer comprising an upper corner at a periphery of the opening, the upper corner having a corner angle with a first degree of sharpness;
removing a portion of the upper corner to reduce the sharpness of the corner angle to a second degree;
after removing the portion of the upper corner, forming insulative material within the opening and over the nitride-containing layer; and
planarizing the insulative material to remove the material from over the nitride-containing layer while leaving the material within the opening in the semiconductive substrate, the material within the opening forming at least a portion of an isolation region.

24. The method of claim 23 wherein the nitride-containing layer comprises silicon nitride.

25. The method of claim 23 wherein the nitride-containing layer consists essentially of silicon nitride.

26. The method of claim 23 wherein the removing the portion of the upper corner comprises facet etching the upper corner.

27. The method of claim 23 wherein the removing the portion of the upper corner comprises facet etching the upper corner, the facet etching comprising exposing the nitride-containing layer to a fluorine-containing compound.

28. The method of claim 23 wherein the removing the portion of the upper corner comprises anisotropically etching the nitride-containing layer.

29. The method of claim 23 wherein the removing the portion of the upper corner comprises exposing the nitride-containing layer to hot phosphoric acid.

30. The method of claim 23 further comprising:
forming a patterned layer of photoresist over the nitride-containing layer, the forming the opening in the nitride-containing layer comprising transferring a pattern from the photoresist to the nitride-containing layer;
removing the photoresist with a photoresist etch chemistry that can also etch the nitride-containing layer; and
continuing to expose the nitride-containing layer to the photoresist etch chemistry after removal of the photoresist to remove the portion of the upper corner.

31. The method of claim 23 wherein the insulative material comprises silicon dioxide.

32. The method of claim 23 wherein the insulative material consists essentially of silicon dioxide.

33. The method of claim 23 wherein the semiconductor substrate comprises monocrystalline silicon.

34. A method of forming an isolation region, comprising:
forming a nitride-containing layer over a semiconductor substrate, the nitride-containing layer comprising at least two portions, one of the at least two portions being an upper portion and the other of the at least two portions being a lower portion, the upper portion etching faster when exposed; to subsequent etching conditions than does the lower portion;
forming an opening extending through the nitride-containing layer and into the underlying substrate, the nitride-containing layer comprising an upper corner at a periphery of the opening, the upper corner having a corner angle with a first degree of sharpness;
removing a portion of the upper corner by the subsequent etching to reduce the sharpness of the corner angle to a second degree;
forming an insulative material within the opening and over the nitride-containing layer; and
planarizing the insulative material to remove the material from over the nitride-containing layer while leaving the material within the opening in the semiconductor substrate, the insulative material within the opening in the semiconductor substrate forming at least a portion of an isolation region.

35. The method of claim 34 wherein:
the forming the nitride-containing layer comprises:
forming the lower portion of silicon nitride; and
forming $Si_xN_yO_z$ wherein x, y and z are greater than zero, over an upper surface of the silicon nitride to form the upper portion; and
the subsequent etching conditions comprise exposing the nitride-containing layer to HF.

36. The method of claim 35 wherein:
the forming the lower portion of silicon nitride comprises chemical vapor deposition utilizing $SiH_2Cl_2$ and $NH_3$; and the forming the upper portion of $Si_xN_yO_z$ comprises chemical vapor deposition utilizing $SiH_2Cl_2$, $NH_3$ and $N_2O$.

37. The method of claim 34 wherein:
the forming the nitride-containing layer comprises:
forming the lower portion of silicon nitride; and
oxidizing an upper surface of the silicon nitride to form the upper portion; and
the subsequent etching conditions comprise exposing the nitride-containing layer to HF.

38. The method of claim 34 wherein:
the forming the nitride-containing layer comprises:
forming the lower portion of silicon nitride utilizing CVD without a plasma; and
forming the upper portion of silicon nitride utilizing plasma enhanced CVD with an oxygen-containing precursor; and
the subsequent etching conditions comprise exposing the nitride-containing layer to HF.

39. The method of claim 34 wherein the nitride-containing layer comprises silicon nitride.

40. The method of claim 34 wherein the nitride-containing layer consists essentially of silicon nitride.

41. The method of claim 34 wherein the insulative material comprises silicon dioxide.

42. The method of claim 34 wherein the insulative material consists essentially of silicon dioxide.

43. The method of claim 34 wherein the semiconductor substrate comprises monocrystalline silicon.

44. A method of forming a material within an opening, comprising:
forming an etch-stop layer over a substrate;
forming a patterned masking layer over the etch-stop layer, the patterned masking layer defining an exposed portion of the etch-stop layer for forming an opening therein;
removing the exposed portion of the etch-stop layer, the removing forming an opening extending therethrough and exposing a portion of, the underlying substrate, the opening through the etch-stop layer comprising an upper corner at a periphery of the opening, the upper corner having a corner angle with a first degree of sharpness;
removing exposed substrate material, the removing extending the opening into the substrate;
forming a first layer of silicon oxide-comprising material within the opening extended into the substrate, the layer not filling the opening and defining a lateral dimension;
reducing the sharpness of the corner angle of the opening to a second degree, the lateral dimension remaining essentially unchanged by the reducing;
after reducing the sharpness forming a second layer of material within the opening and over the etch-stop layer and the first layer, the second layer filling the opening extended into the substrate; and
removing the material from over the etch-stop layer while leaving the material within the opening.

* * * * *

UNITED STATES PATENT AND TRADEMARK OFFICE
CERTIFICATE OF CORRECTION

PATENT NO. : 6,420,268 B2
DATED : July 16, 2002
INVENTOR(S) : John T. Moore et al.

It is certified that error appears in the above-identified patent and that said Letters Patent is hereby corrected as shown below:

Column 2,
Line 27, replace "24 (FIG. 51) to form oxide plugs 30 within" with -- 24 (FIG. 5) to form oxide plugs 30 within --

Column 4,
Line 64, replace "Power within the reaction chamber cad be" with -- Power within the reaction chamber can be --

Column 5,
Line 56, replace "can comprise identical mate rials as etch-stop" with -- can comprise identical materials as etch-stop --
Line 66, replace "temperature of less than about 5° C., and a" with -- temperature of less than about 50° C., and a --

Column 6,
Line 19, replace "lead lo to overhanging oxide ledges (not shown)" with -- lead to overhanging oxide ledges (not shown) --
Line 67, replace "for example, rapid thermal processing at al tem-" with -- for example, rapid thermal processing at a tem- --

Column 8,
Line 52, replace "The method of claim 1 wherein the material comprises" with -- The method of claim 1 wherein the second layer material comprises --

Column 9,
Line 4, replace "the first layer and pad oxidie layer" with -- the first layer and pad oxide layer --
Line 29, insert at the end of claim 8 before the period -- , and wherein the first layer of material and the pad oxide layer prevent exposing the substrate to the flourine-containing compound --.
Line 32, insert at the end of claim 9 before the period -- , and wherein the first layer of material and the pad oxide layer prevent anisotropically etching of the substrate --.
Line 35, insert at the end of claim 10 before the period -- , and wherein the first layer of material and the pad oxide layer prevent exposing the substrate to the hot phosphoric acid --.
Line 45, insert at the end of claim 11 before the period -- , wherein the first layer of material and the pad oxide layer prevent exposing the substrate to the photoresist etch chemistry. --

UNITED STATES PATENT AND TRADEMARK OFFICE
CERTIFICATE OF CORRECTION

PATENT NO. : 6,420,268 B2
DATED : July 16, 2002
INVENTOR(S) : John T. Moore et al.

It is certified that error appears in the above-identified patent and that said Letters Patent is hereby corrected as shown below:

Column 9 cont'd
Line 46, replace "of claim 4 wherein the layer" with -- of claim 4 wherein the second layer --
Line 48, replace "of claim 4 wherein the layer" with -- of claim 4 wherein the second layer --
Line 53, replace "forming a nitride-containing layer over a substrate," with -- forming a nitride-containing layer over a substrate and overlying a pad oxide layer, --
Line 61, replace "the underlying substrate," with -- the underlying substrate, the exposed portion of the substrate etched to further extend the opening into the substrate, --
Line 64, insert new paragraph after "first degree of sharpness"; with -- prior to the subsequent etching, forming a first silicon oxide layer within the opening extended into the substrate, the first layer contiguous with the pad oxide layer and not filling the opening, wherein the first layer and pad oxide layer define essentially square corners of the opening extended into the substrate; --
Line 67, replace "a second degree;" with -- a second degree while not changing the essentially square corners of the opening extended into the substrate; --

Column 10,
Line 1, replace "forming a layer of material within the opening" with -- forming a second layer of material within the opening --
Line 2, replace "the nitride-containing layer; and" with -- the nitride-containing layer, the second layer filling the opening; and --
Line 37, replace "of claim 14 wherein the layer" with -- of claim 14 wherein the second layer --
Line 39, replace "of claim 14 wherein the layer" with -- of claim 14 wherein the second layer --
Line 45, insert new paragraph after "comprising:" with -- forming a pad oxide layer over a semiconductor substrate; --
Line 46, replace "forming a nitride-containing layer over a semiconductor" with -- forming a nitride-containing layer over the semiconductor substrate, --
Line 47, replace "substrate;" with -- substrate, the nitride-containing layer overlying the pad oxide layer; --
Line 49, replace "containing layer and into the underlying substrate, the" with -- containing layer and the pad oxide layer and into the underlying substrate, the opening formed in the underlying substrate having essentially square corners proximate the pad oxide layer and the nitride-containing layer comprising an upper --

UNITED STATES PATENT AND TRADEMARK OFFICE
CERTIFICATE OF CORRECTION

PATENT NO.     : 6,420,268 B2
DATED          : July 16, 2002
INVENTOR(S)    : John T. Moore et al.

It is certified that error appears in the above-identified patent and that said Letters Patent is hereby corrected as shown below:

Column 10 cont'd,
Line 54, replace "sharpness of the corner angle to a second degree;" with -- sharpness of the corner angle to a second degree, the removing not changing the essentially square corners of the opening in the substrate; --

Column 11,
Line 30, insert new paragraph after "comprising:" with -- forming first layer over a semiconductor substrate, the first layer comprising silicon oxide; --
Lines 31 and 32, replace "forming a nitride-containing layer over a semiconductor substrate," with -- forming a nitride-containing layer over the first layer, --
Lines 36 and 37, replace "faster when exposed; to subsequent etching conditions" with -- faster when exposed to subsequent etching conditions --
Line 39, replace "containing layer and into the underlying substrate," with -- containing layer, the first layer and into the underlying substrate, --
Line 42, replace "corner angle with a first degree of sharpness;" with -- corner angle with a first degree of sharpness, and the opening extending into the substrate comprising essentially square corners proximate the first layer; --
Line 45, replace "a second degree;" with -- a second degree, the removing not altering the shape of the essentially square corners of the opening in the substrate; --

Signed and Sealed this

Second Day of September, 2003

JAMES E. ROGAN
*Director of the United States Patent and Trademark Office*